United States Patent
Chen

(10) Patent No.: US 9,883,611 B2
(45) Date of Patent: Jan. 30, 2018

(54) FAN CONTROL CIRCUIT

(71) Applicant: HON HAI PRECISION INDUSTRY CO., LTD., New Taipei (TW)

(72) Inventor: Yu-Chia Chen, New Taipei (TW)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 558 days.

(21) Appl. No.: 14/512,802

(22) Filed: Oct. 13, 2014

(65) Prior Publication Data

US 2016/0066470 A1    Mar. 3, 2016

(30) Foreign Application Priority Data

Sep. 1, 2014    (TW) .................................. 103130086

(51) Int. Cl.
*H05K 7/20*    (2006.01)
*G06F 1/20*    (2006.01)

(52) U.S. Cl.
CPC .......... *H05K 7/20209* (2013.01); *G06F 1/206* (2013.01)

(58) Field of Classification Search
CPC ............. H05K 7/20209; H04D 27/004; H04D 15/0066; F04D 27/004; F04D 15/0066; G06F 1/206
USPC .......... 165/247; 236/1 C, 49.3, 78 B, DIG. 9
See application file for complete search history.

(56) References Cited

U.S. PATENT DOCUMENTS

| | | | |
|---|---|---|---|
| 6,182,902 B1 * | 2/2001 | Shih ....................... | G05D 23/24 236/DIG. 9 |
| 6,617,815 B1 * | 9/2003 | Krief ...................... | G06F 1/206 236/74 R |
| 7,789,130 B2 * | 9/2010 | Chen ...................... | F04D 27/004 165/247 |
| 8,905,721 B2 | 12/2014 | Ma et al. | |
| 2007/0017668 A1 * | 1/2007 | Park .................... | H05K 7/20209 236/49.3 |
| 2008/0181586 A1 * | 7/2008 | Fan .................... | H05K 7/20209 388/830 |
| 2009/0228148 A1 * | 9/2009 | Byquist ................. | G01K 1/026 700/275 |

(Continued)

FOREIGN PATENT DOCUMENTS

CN    1721704 A    1/2006
CN    201007800 Y    1/2008
(Continued)

*Primary Examiner* — Len Tran
*Assistant Examiner* — Hans Weiland
(74) *Attorney, Agent, or Firm* — ScienBiziP, P.C.

(57) ABSTRACT

A fan control circuit drives and adjusts a rotation speed of a fan according to operating temperatures of a plurality of heat elements. The fan control circuit includes a plurality of temperature detection units, a temperature synthesizing unit, and a driving signal generation unit. Each of the temperature detection units respectively detects the operation temperature of each of the heat elements and outputs a temperature detection signal corresponding to each of the heat elements. The temperature synthesizing unit calculates and outputs mean temperature signals according to the plurality of temperature detection signals and a plurality of predetermined weighted values corresponding to the heat elements. The driving signal generation unit generates driving signals to the fan according to the mean temperature signals.

7 Claims, 2 Drawing Sheets

(56) References Cited

U.S. PATENT DOCUMENTS

| 2011/0226463 | A1 | 9/2011 | Cao |
| 2012/0081173 | A1* | 4/2012 | Hsieh .................. H03K 4/066 |
| | | | 327/512 |
| 2014/0070749 | A1 | 3/2014 | Chiu |

FOREIGN PATENT DOCUMENTS

| CN | 101730871 A | 6/2010 |
| CN | 102444603 A | 5/2012 |
| CN | 202443344 U | 9/2012 |
| CN | 103775366 A | 5/2014 |
| JP | 201374013 A | 4/2013 |

* cited by examiner

FAN CONTROL CIRCUIT

FIELD

The disclosure relates to electronic devices, and particularly to a fan control circuit of an electronic device.

BACKGROUND

In current practice, most of electronic devices need one or more fans to dissipate heat, and a fan control circuit drives and adjusts a rotation speed of the fan according to an operating temperature of the electronic device. It is challenging to make a fan control circuit that can adjust a rotation speed of a fan according to operating temperatures of chips of an electronic device.

BRIEF DESCRIPTION OF THE DRAWINGS

Implementations of the present technology will now be described, by way of example only, with reference to the attached figures.

DETAILED DESCRIPTION

Figure 1:
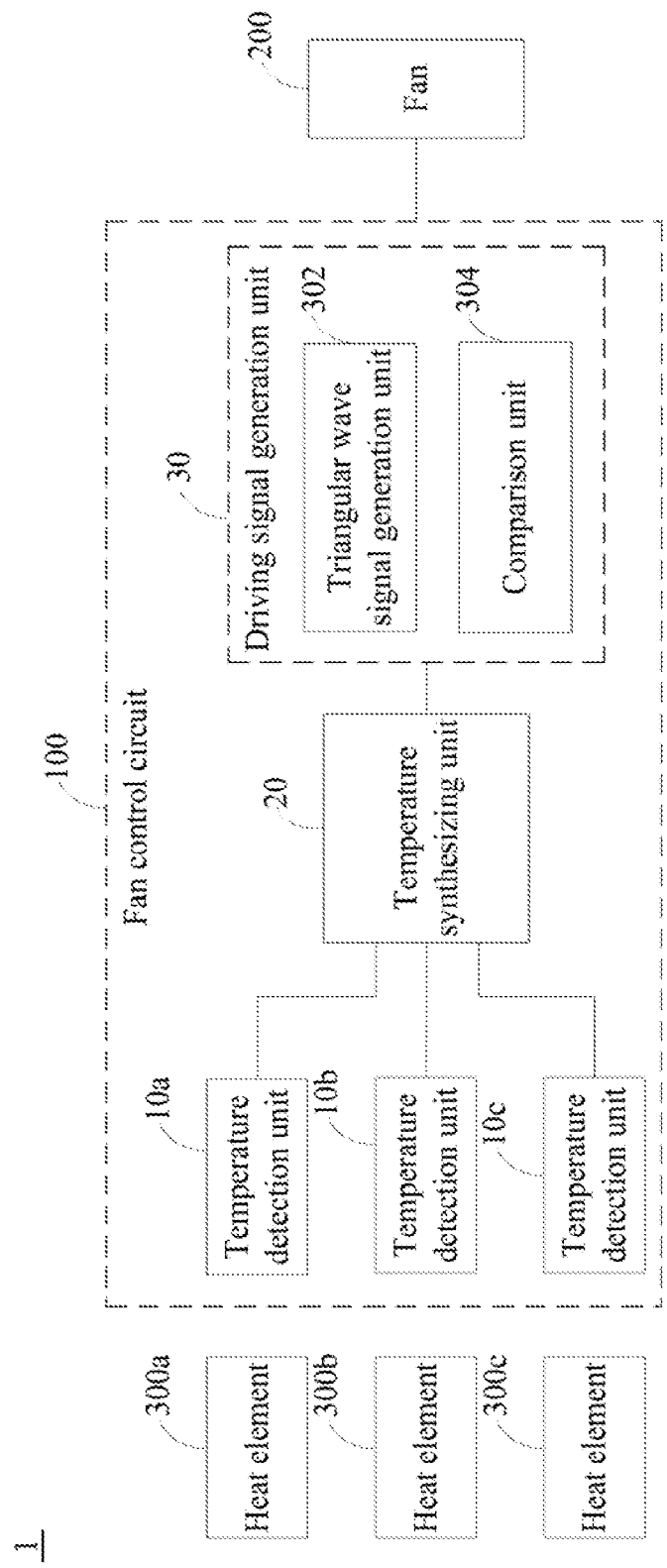
FIG. 1 is a diagrammatic view of a first embodiment of a fan control circuit.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. Also, the description is not to be considered as limiting the scope of the embodiments described herein. The drawings are not necessarily to scale and the proportions of certain parts have been exaggerated to better illustrate details and features of the present disclosure.

Several definitions that apply throughout this disclosure will now be presented.

The term "coupled" is defined as connected, whether directly or indirectly through intervening components, and is not necessarily limited to physical connections. The connection can be such that the objects are permanently connected or releasably connected. The term "comprising," when utilized, means "including, but not necessarily limited to"; it specifically indicates open-ended inclusion or membership in the so-described combination, group, series and the like.

The present disclosure is described in relation to a fan control circuit.

FIG. 1 illustrates a diagrammatic view of a fan control circuit 100. In at least one embodiment, an electronic device 1 comprises the fan control circuit 100, a fan 200, and a plurality of heat elements 300a, 300b, and 300c (three shown as a non-limiting example). The fan control circuit 100 drives the fan 200 to dissipate heat produced by the heat elements 300a, 300b, and 300c. The fan control circuit 100 comprises a plurality of temperature detection units 10a, 10b, and 10c (three shown as a non-limiting example), a temperature synthesizing unit 20, and a driving signal generation unit 30. Each of the temperature detection units 10a, 10b, and 10c respectively detects an operation temperature of each of the heat elements 300a, 300b, and 300c, and outputs a temperature detection signal corresponding to each of the operation temperatures of the heat elements 300a, 300b, and 300c.

In at least one embodiment, each of the heat elements 300a, 300b, and 300c can be a control chip, a transformer, and a switch element comprising the electronic device 1. The temperature detection signals are voltage signals, and the number of the temperature detection units 10a, 10b, and 10c is determined by the number of the heat elements 300a, 300b, and 300c.

The temperature synthesizing unit 20 is coupled to the plurality of temperature detection units 10a, 10b, and 10c, the temperature synthesizing unit 20 calculates and outputs mean temperature signals according to the plurality of temperature detection signals output by the temperature detection units 10a, 10b, and 10c and a plurality of predetermined weighted values which are corresponding to the heat elements 300a, 300b, and 300c.

In at least one embodiment, each of the heat elements 300a, 300b, 300c is corresponding to the predetermined weighted value, and the higher importance level the heat element has, the larger the predetermined weighted value is. The importance level of the heat element can be determined by a developer according to an operation temperature requirement and a temperature tolerance of the heat element. The mean temperature signals can be calculated by formulas as shown below:

$$Um = \frac{A*V1 + B*V2 + C*V3}{A + B + C}$$

In these formulas, Um represents the voltage of the mean temperature signals. A, B, and C represent the predetermined weighted values of the heat elements 300a, 300b, 300c, respectively. V1, V2 and V3 represent voltage of the detected temperature signals output by the temperature detection units 10a, 10b, and 10c, respectively.

The driving signal generation unit 30 is coupled to the temperature synthesizing unit 20. The driving signal generation unit 30 generates driving signals according to the mean temperature signals output by the temperature synthesizing unit 20, to drive and adjust a rotation speed of the fan 200 to achieve heat dissipation.

In at least one embodiment, the driving signals can be pulse width modulation (PWM) signals. The driving signal generation unit 30 adjusts duty cycles of the driving signals according to the mean temperature signals output by the temperature synthesizing unit 20 adjusting the rotation speed of the fan 200, to achieve energy savings and noise reduction.

In at least one embodiment, the driving signal generation unit 30 further comprises a triangular wave signal generation unit 302 and a comparison unit 304. The triangular wave signal generation unit 302 generates and outputs triangular wave signals, and a frequency of the triangular wave signals is determined by an operation frequency of the fan 200. The comparison unit 304 generates the driving signals according to the mean temperature signals output by the temperature synthesizing unit 20 and the triangular wave signals output by the triangular wave signal generation unit 302.

Figure 2:
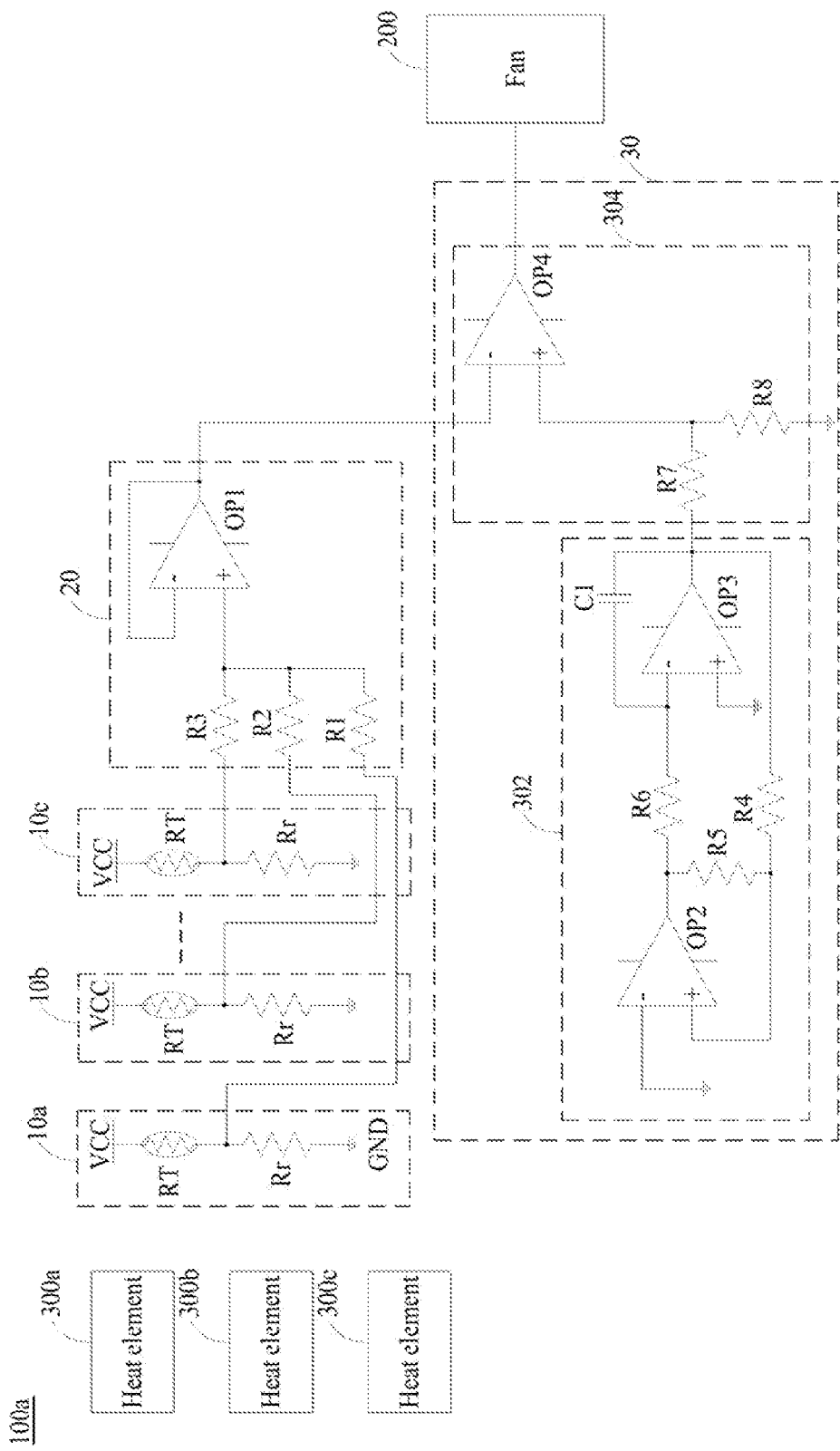
FIG. 2 is a circuit diagram of a first embodiment of a fan control circuit.

FIG. 2 illustrates a circuit diagram of a fan control circuit 100a. In at least one embodiment, each of the temperature detection units 10a, 10b, and 10c comprises a thermistor RT and a current limiting resistor Rr coupled in series between a power source VCC and a ground GND. The temperature detection units 10a, 10b, and 10c respectively detect operation temperatures of the heat elements 300a, 300b, and 300c via the thermistor RT. The thermistor RT can be a negative temperature coefficient resistor.

The temperature synthesizing unit 20 comprises a first comparator OP1, a first resistor R1, a second resistor R2, and a third resistor R3. The first comparator OP1 comprises a positive input terminal, a negative input terminal, and an output terminal, and the negative input terminal of the first comparator OP1 is coupled to the output terminal of the first comparator OP1. A first end of the first resistor R1 is coupled to a node between the thermistor RT and the current limiting resistor Rr comprising the temperature detection unit 10a, and a second end of the first resistor R1 is coupled to the positive input terminal of the first comparator OP1. A first end of the second resistor R2 is coupled to a node between the thermistor RT and the current limiting resistor Rr comprising the temperature detection unit 10b, and a second end of the second resistor R2 is coupled to the positive input terminal of the first comparator OP1. A first end of the third resistor R3 is coupled to a node between the thermistor RT and the current limiting resistor Rr comprising the temperature detection unit 10c, and a second end of the third resistor R3 is coupled to the positive input terminal of the first comparator OP1.

In at least one embodiment, a resistance of the current limiting resistor Rr is equivalent to a resistance of the thermistor RT which is in a normal atmospheric temperature. Resistances of the first resistor R1, the second resistor R2, and the third resistor R3 are greater than ten times the resistance of the current limiting resistor Rr to decrease temperature detection errors. In other embodiments, other types of temperature sensors can take the place of the thermistor RT, and the temperature synthesizing unit 20 can also calculate and output mean temperature signals via other circuit diagrams.

The triangular wave signal generation unit 302 comprises a second comparator OP2, a third comparator OP3, a fourth resistor R4, a fifth resistor R5, a sixth resistor R6, and a capacitor C1. The second comparator OP2 comprises a positive input terminal, a negative input terminal, and an output terminal. The positive input terminal of the second comparator OP2 is coupled to a first end of the fourth resistor R4, and the negative input terminal of the second comparator OP2 is grounded. A first end of the fifth resistor R5 is coupled to the output terminal of the second comparator OP2, and a second end of the fifth resistor R5 is coupled to a node between the fourth resistor R4 and the second comparator OP2. A first end of the sixth resistor R6 is coupled to a node between the fifth resistor R5 and the output terminal of the second comparator OP2. The third comparator OP3 comprises a positive input terminal, a negative input terminal, and an output terminal. The positive input terminal of the third comparator OP3 is grounded, the negative input terminal of the third comparator OP3 is coupled to a second end of the sixth resistor R6, and the output terminal of the third comparator OP3 is coupled to a second end of the fourth resistor R4. The capacitor C1 is coupled to the negative input terminal of the third comparator OP3 and the output terminal of the third comparator OP3. The frequency of the triangular wave signals output by the triangular wave signal generation unit 302 can be calculated by formulas as shown below:

$$F = \frac{R5}{4 * R4 * R6 * C1}$$

In these formulas, F represents the frequency of the triangular wave signals. R4, R5 and R6 represent resistances of the fourth resistor R4, the fifth resistor R5 and the sixth resistor R6, respectively. C1 represents capacitance of the capacitor C1. The triangular wave signal generation unit 302 adjusts the resistances of the fourth resistor R4, the fifth resistor R5 and the sixth resistor R6, or the capacitance of the capacitor C1 to adjust the frequency of the triangular wave signals. In other embodiments, a triangular wave signal generator can take the place of the triangular wave signal generation unit 302 to output the triangular wave signals.

The comparison unit 304 comprises a fourth comparator OP4, a seventh resistor R7, and an eighth resistor R8. The fourth comparator OP4 comprises a positive input terminal, a negative input terminal, and an output terminal. The negative input terminal of the fourth comparator OP4 is coupled to the output terminal of the first comparator OP1, and the output terminal of the fourth comparator OP4 is coupled to the fan 200. A first end of the seventh resistor R7 is coupled to the output terminal of the third comparator OP3, and a second end of the seventh resistor R7 is coupled to the positive input terminal of the fourth comparator OP4. A first end of the eighth resistor R8 is coupled to a node between the seventh resistor R7 and the fourth comparator OP4, and a second end of the eighth resistor R8 is grounded. The fourth comparator OP4 receives and compares the mean temperature signals output by the temperature synthesizing unit 20 and the triangular wave signals output by the triangular wave signal generation unit 302 to output the driving signals. The comparison unit 304 can adjust the resistances of the seventh resistor R7 and the eighth resistor R8 to adjust a voltage value of the driving signals to drive the fan 200.

The embodiments shown and described above are only examples. Many details are often found in the art such as the other features of a fan control circuit. Therefore, many such details are neither shown nor described. Even though numerous characteristics and advantages of the present technology have been set forth in the foregoing description, together with details of the structure and function of the present disclosure, the disclosure is illustrative only, and changes may be made in the detail, especially in matters of shape, size and arrangement of the parts within the principles of the present disclosure up to, and including the full extent established by the broad general meaning of the terms used in the claims. It will therefore be appreciated that the embodiments described above may be modified within the scope of the claims.

What is claimed is:

1. A fan control circuit comprising:
   a plurality of temperature detection units, each of the temperature detection units configured to detect an operation temperature of each of a plurality of heat elements, respectively, and output a temperature detection signal corresponding to each of the heat elements;
   a temperature synthesizing unit coupled to the plurality of temperature detection units, the temperature synthesizing unit configured to calculate and output mean temperature signals according to the plurality of temperature detection signals and a plurality of predetermined weighted values corresponding to the heat elements;

a driving signal generation unit coupled to the temperature synthesizing unit, the driving signal generation unit configured to generate driving signals to a fan, according to the mean temperature signals, the driving signal generation unit comprising a triangular wave signal generation unit configured to generate triangular wave signals, and the triangular wave signal generation unit comprising:

a first comparator comprising a positive input terminal, a negative input terminal, and an output terminal, the negative input terminal grounded;

a first resistor with a first end coupled to the positive input terminal of the first comparator;

a second resistor with a first end coupled to the output terminal of the first comparator and a second end coupled to a node between the first resistor and the first comparator;

a third resistor with a first end coupled to the output terminal of the first comparator;

a second comparator comprising a positive input terminal, a negative input terminal, and an output terminal, the positive input terminal grounded, the negative input terminal coupled to a second end of the third resistor, and the output terminal coupled to a second end of the first resistor; and a capacitor coupled between the negative input terminal of the second comparator and the output terminal of the second comparator;

wherein, frequency of the triangular wave signals output by the triangular wave signal generation unit is calculated by formulas: $R5/(4*R4*R6*C1)$, and F represents the frequency of the triangular wave signals, and R4 represents resistances of the first resistor, R5 represents resistances of the second resistor, R6 represents resistances of the third resistor, and C1 represents capacitance of the first capacitor.

2. The fan control circuit of claim 1, wherein the temperature synthesizing unit comprises:

a comparator comprising a positive input terminal, a negative input terminal, and an output terminal, the negative input terminal coupled to the output terminal; and a plurality of resistors, a first end of each of the resistors respectively coupled to each of the temperature detection units and a second end of each of the resistors all coupled to the positive input terminal of the comparator.

3. The fan control circuit of claim 1, wherein the driving signal generation unit comprises:

a comparison unit configured to generate the driving signals according to the mean temperature signals and the triangular wave signals.

4. The fan control circuit of claim 3, wherein a frequency of the triangular wave signals is determined by an actual rotation frequency of the fan.

5. The fan control circuit of claim 3, wherein the comparison unit comprises:

a comparator comprising a positive input terminal, a negative input terminal, and an output terminal, the negative input terminal coupled to the temperature synthesizing unit, and the output terminal coupled to the fan; and a first resistor with a first end coupled to the triangular wave signal generation unit and a second end coupled to the positive input terminal of the comparator; and a second resistor with a first end coupled to a node between the first resistor and the comparator and a second end grounded.

6. The fan control circuit of claim 1, wherein the driving signals comprise pulse width modulation (PWM) signals, and the driving signal generation unit adjusts duty cycles of the driving signals according to the mean temperature signals output by the temperature synthesizing unit to adjust a rotation speed of the fan.

7. The fan control circuit of claim 1, wherein each of the temperature detection unit comprises a thermistor and a current limiting resistor coupled in series between a power source and a ground.

* * * * *